(12) United States Patent
Zhang

(10) Patent No.: US 12,090,738 B2
(45) Date of Patent: Sep. 17, 2024

(54) SCREEN PROTECTOR ASSEMBLY, SCREEN PROTECTOR APPLYING ASSEMBLY AND SCREEN PROTECTOR APPLICATOR

(71) Applicant: Ping Zhang, Cranberry Township, PA (US)

(72) Inventor: Ping Zhang, Cranberry Township, PA (US)

(*) Notice: Subject to any disclaimer, the term of this patent is extended or adjusted under 35 U.S.C. 154(b) by 0 days.

(21) Appl. No.: 18/203,629

(22) Filed: May 30, 2023

(65) Prior Publication Data

US 2024/0059043 A1 Feb. 22, 2024

(30) Foreign Application Priority Data

Aug. 19, 2022 (CN) .......................... 202222188381.3
Aug. 19, 2022 (CN) .......................... 202222189510.0

(51) Int. Cl.
| | | |
|---|---|---|
| *B32B 3/24* | (2006.01) | |
| *B32B 3/08* | (2006.01) | |
| *B32B 3/26* | (2006.01) | |
| *B32B 7/12* | (2006.01) | |
| *B29C 63/00* | (2006.01) | |
| *B29C 63/02* | (2006.01) | |
| *B29L 31/34* | (2006.01) | |
| *B32B 38/18* | (2006.01) | |
| *H04B 1/3888* | (2015.01) | |
| *H05K 13/00* | (2006.01) | |

(52) U.S. Cl.
CPC ............... *B32B 3/08* (2013.01); *B32B 3/266* (2013.01); *B32B 7/12* (2013.01); *B29C 2063/0008* (2013.01); *B29C 63/0095* (2013.01); *B29C 63/02* (2013.01); *B29L 2031/3437* (2013.01); *B32B 38/1841* (2013.01); *B32B 2307/748* (2013.01); *B32B 2457/00* (2013.01); *G06F 2200/1634* (2013.01); *H04B 1/3888* (2013.01); *H05K 13/0015* (2013.01); *Y10T 156/1744* (2015.01)

(58) Field of Classification Search
CPC ........ B29C 2063/0008; B29C 63/0095; B29C 63/002; Y10T 156/1744; H05K 13/0015; B29L 2031/3437; B32B 38/1841; B32B 3/266; H04B 1/3888; G06F 2200/1634
See application file for complete search history.

(56) References Cited

U.S. PATENT DOCUMENTS

2021/0176351 A1* 6/2021 Bulkley ................ B29C 66/861
2022/0332107 A1* 10/2022 Du ..................... B32B 37/0046

* cited by examiner

Primary Examiner — William P Watkins, III
(74) Attorney, Agent, or Firm — IPro, PLLC

(57) ABSTRACT

Disclosed herein are a screen protector assembly, a screen protector applying assembly and a screen protector applicator. The screen protector assembly comprises a screen protector layer, a retention layer and a first matching member. The retention layer is bonded to the screen protector layer. The first matching member is fixedly connected to the retention layer, and the first matching member is used to be detachably connected to a protector applying assembly. With the above arrangement, a detachable connection between the retention layer of the screen protector assembly and the protector applying assembly is realized, allowing the retention layer to be detached from the protector applying assembly after a protector is applied to a screen, thereby allowing the protector applying assembly to be reused, and saving costs.

28 Claims, 15 Drawing Sheets

SCREEN PROTECTOR ASSEMBLY, SCREEN PROTECTOR APPLYING ASSEMBLY AND SCREEN PROTECTOR APPLICATOR

RELATED APPLICATION FIELD

The present application claims priority to Chinese Patent Applications Nos. 202222188381.3 and 202222189510.0.

TECHNICAL FIELD

The present disclosure relates to the technical field of screen protector application, and in particular, to a screen protector assembly, a screen protector applying assembly and a screen protector applicator.

BACKGROUND

Nowadays, electronic devices such as mobile phones and tablets have become indispensable tools in many people's lives. In order to make it convenient for users to apply protectors on screens of electronic devices, screen protector applicators have emerged accordingly.

Generally, a screen protector applicator includes a screen protector assembly and a protector applying assembly. The screen protector assembly includes a screen protector layer and a retention layer attached to the screen protector layer. The retention layer is connected to the protector applying assembly, and the protector applying assembly is used to assist the retention layer to be attached to a device to which a protector is to be applied. The retention layer and the protector applying assembly are fixedly connected. When the retention layer and the screen protector layer are peeled off, the retention layer and the protector applying assembly are fixedly connected together, and thereby the protector applying assembly cannot be reused, resulting in waste. Alternatively, the retention layer is forcibly detached from the protector applying assembly. When the protector applying assembly needs to be reused, the retention layer of the screen protector assembly is bonded to the protector applying assembly. After this fixing method by bonding is carried out many times, it is easy to affect the flatness of the bonded part of the protector applying assembly, thereby affecting the parallelism of the screen protector assembly relative to the screen of the device to be applied with the protector.

SUMMARY

Embodiments of the present disclosure are intended to provide a screen protector assembly and a screen protector applicator, so as to solve the technical problem of inconvenient disassembly and assembly of the retention layer of the screen protector assembly and the protector applying assembly in the prior art.

In a first aspect, the present disclosure provides a screen protector assembly. The screen protector assembly comprises: a screen protector layer, one side of which is used to be bonded to a screen of a device; a retention layer dimensioned to conform to the screen protector layer and bonded to the other side of the screen protector layer; and a first matching member fixedly connected to the retention layer, wherein bonding strength between the screen protector layer and the screen is greater than bonding strength between the retention layer and the screen protector layer, connection strength between the retention layer and the first matching member is greater than the bonding strength between the retention layer and the screen protector layer, and the first matching member is used to be detachably connected to a screen protector applying assembly for applying the screen protector layer to the screen.

In an embodiment, the screen protector assembly further comprises a cover layer bonded on the one side of the screen protector layer so as to provide protection for the screen protector layer.

In an embodiment, the screen protector assembly comprises at least two first matching members, and the first matching members are distributed on different positions of the retention layer.

In an embodiment, the screen protector assembly comprises four first matching members, and the four first matching members are distributed on four corners of the retention layer.

In an embodiment, the first matching member has a ball, and the screen protector applying assembly has a socket; or the first matching member has a socket, and the screen protector applying assembly has a ball, so that the first matching member can be snap-fitted to the screen protector applying assembly.

In an embodiment, the retention layer and the screen protector layer is separated in an area. For example, there may be a separator piece in this area and sandwiched between the retention layer and the screen protector layer.

In an embodiment, the first matching member is connected to the screen protector applying assembly by magnetic attraction; the first matching member comprises a fixing plate; the fixing plate has a first fixing surface and a second fixing surface, and the first fixing surface and the second fixing surface are opposite and parallel to the retention layer; the second fixing surface and the first fixing surface are arranged at a preset angle; and the first fixing surface is fixedly connected to the retention layer in the middle of the retention layer.

In an embodiment, the first matching member further comprises a boss, the boss is fixedly connected to the fixing plate, and the boss is used to position the screen protector assembly on the screen protector applying assembly.

In a second aspect, the present disclosure provides a screen protector applying assembly. The screen protector applying assembly comprises: at least two protector applying members, each of the protector applying members comprising a base plate, an enclosure plate and a positioning ridge, wherein the base plate has a base surface configured to connect (fixedly or detachably) to a screen protector assembly; one end of the enclosure plate is fixedly connected to the base plate, and the other end of the enclosure plate extends along a direction the base surface faces; the positioning ridge is fixedly connected to the base plate, and the positioning ridge is located on an inner side of the enclosure plate; the positioning ridge has a positioning surface on a side of the positioning ridge facing away from the base surface, and the positioning surface is used to abut against a screen of a device to which the screen protector assembly is applied; and a height of the enclosure plate relative to the base surface is greater than that of the positioning ridge.

In an embodiment, the enclosure plate has a first limiting surface on an inner side of the enclosure plate, and the first limiting surface is used to abut against a corner or an edge of the device; and the positioning ridge further has a second limiting surface on a side of the positioning ridge facing away from the enclosure plate, and the second limiting surface is used to abut against the screen protector assembly.

In an embodiment, in each of the protector applying members, one or both of the enclosure plate and the positioning ridge are arranged in sections on the base plate.

In an embodiment, the base plate further has an inclined surface connected to the base surface, the inclined surface is closer to the positioning ridge than the base surface, and the inclined surface and the base surface are arranged at a preset angle.

In an embodiment, one of the protector applying members is arc-shaped or right angle-shaped as a whole, and is used to be placed at a corner of the device; or one of the protector applying members is long and straight as a whole, and is used to be placed on a long side or a short side of the device; or one of the protector applying members is long and straight in its middle, and bent on both ends to form an arc or a right angle. In an embodiment, the screen protector applying assembly may have any combination of protector applying members of these shapes.

In an embodiment, the screen protector applying assembly comprises two protector applying members each being long and straight in its middle and bent on both ends to form an arc or a right angle, and the two protector applying members are used to be symmetrically placed on long sides or short sides of the device.

In an embodiment, the screen protector applying assembly comprises at least four protector applying members each being long and straight as a whole, and the at least four protector applying members are used to be placed on four sides or two opposite sides of the device.

In an embodiment, a stepped portion is formed on an outer side of each of the protector applying members for allowing two or more protector applying members to be stacked together.

In an embodiment, the screen protector applying assembly further comprises at least two second matching members respectively fixedly connected to the at least two protector applying members, wherein each of the at least two second matching members is used to be detachably connected to a first matching member of the screen protector assembly.

In an embodiment, the at least two second matching members are fixedly connected to the at least two protector applying members, respectively.

In an embodiment, each of the at least two second matching members is fixedly connected to the base surface of the base plate of the corresponding protector applying member.

In an embodiment, the screen protector applying assembly comprises four protector applying members and four second matching members; the screen protector assembly comprises four first matching members; one of the first matching members corresponds to one of the protector applying members and one of the second matching members; the four first matching members are distributed on four corners of a retention layer of the screen protector assembly; and the four protector applying members are used to be placed on four corners of the device, respectively.

In a third aspect, the present disclosure provides a screen protector applicator. The screen protector applicator comprises any one of the screen protector assemblies described above and any one of the screen protector applying assemblies described above, wherein the retention layer of the screen protector assembly is connected to the base surface of the screen protector applying assembly.

BRIEF DESCRIPTION OF FIGURES

One or several embodiments are exemplified by corresponding figures in the drawings. These exemplified descriptions do not constitute a limitation on the embodiments. The elements with the same reference numerals in the drawings are denoted as similar elements. Unless otherwise stated, the figures in the drawings do not constitute a scale limitation.

Figure 1:
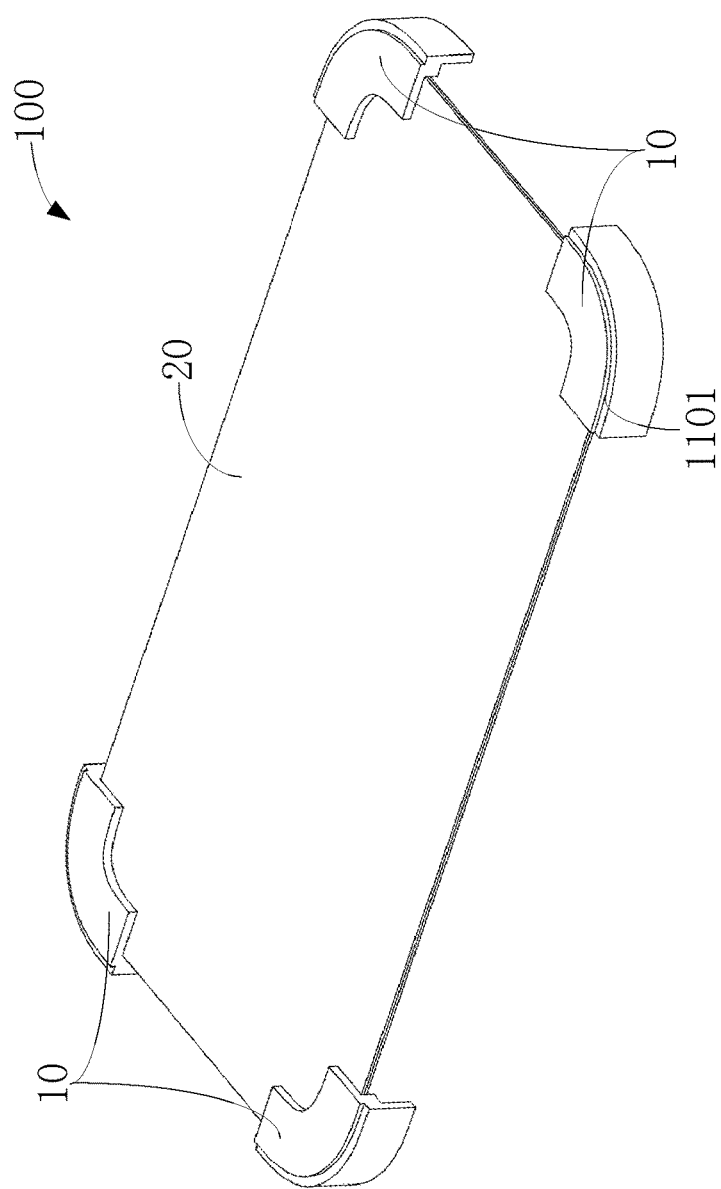
FIG. 1 is a schematic structural view of a screen protector applicator provided in an embodiment of the present disclosure.

Reference numerals are shown in the following table:

| | |
|---|---|
| Screen protector applicator 100 | Protector applying assembly 10 |
| Protector applying member 11 | Base plate 111 |
| Base surface 1111 | Inclined surface 1112 |
| Enclosure plate 112 | First limiting surface 1121 |
| Positioning ridge 113 | Positioning surface 1131 |
| Second limiting surface 1132 | Stepped portion 1101 |
| Second matching member 12 | Partition 13 |
| Positioning hole 1301 | Screen protector assembly 20 |
| Retention layer 21 | Screen protector layer 22 |

-continued

| | |
|---|---|
| Cover layer 23 | First matching member 24 |
| Fixing plate 241 | First fixing surface 2411 |
| Second fixing surface 2412 | Boss 242 |
| Ball 243 | Socket 131 |

DETAILED DESCRIPTION

In order to facilitate the understanding of the present disclosure, the present disclosure will be described below in more detail with reference to the drawings and specific embodiments. It should be noted that when an element is referred to as being "connected to" another element, it may be directly on another element, or one or several intermediate elements may exist between them. The orientations or positional relationships indicated by the terms used in the description, such as "up", "down", "left", "right", "upper end", "lower end", "top" and "bottom", are based on the orientations or positional relationships shown in the drawings, which is only for the purpose of facilitating the description of the present disclosure and simplifying the description, rather than indicating or implying that the device or element referred to must have a specific orientation, and construct and operate in a specific orientation. Therefore, these cannot be understood as a limitation on the present disclosure. In addition, the terms "first", "second", etc. are only used for descriptive purposes, and cannot be understood as the indication or implication of relative importance.

Unless otherwise defined, all technical and scientific terms used in the description have the same meanings as commonly understood by those skilled in the technical field of the present disclosure. The terms used in the description of the present disclosure are merely for the purpose of describing specific embodiments, and are not used to limit the present disclosure.

Figure 2:
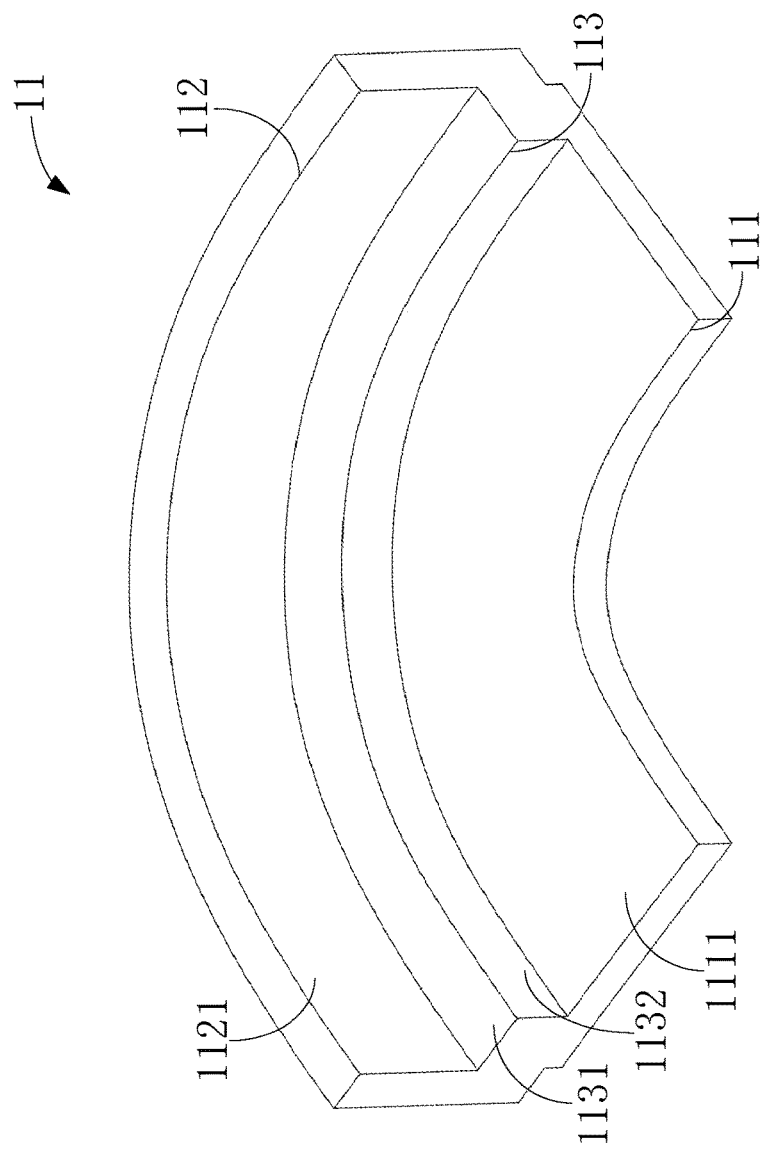
FIG. 2 is a structural perspective view of a protector applying member of a protector applying assembly of the screen protector applicator shown in FIG. 1.

Referring to FIGS. 1 and 2, FIG. 1 is a schematic structural view of a screen protector applicator 100 provided in an embodiment of the present disclosure, and FIG. 2 is a structural perspective view of a protector applying member 11 of a protector applying assembly 10 of the screen protector applicator 100 shown in FIG. 1.

The screen protector applicator 100 includes the protector applying assembly 10 and a screen protector assembly 20. The screen protector assembly 20 is connected to the protector applying assembly 10, and the protector applying assembly 10 is used to assist the screen protector assembly 20 to be attached to a device to which a protector is to be applied (simply referred to as a device to be applied with a protector hereinafter). During protector application, the screen protector assembly 20 is connected to the protector applying assembly 10 and is aligned with the device.

The protector applying assembly 10 includes protector applying members 11. The protector applying member 11 includes a base plate 111, an enclosure plate 112 and a positioning ridge 113, and the enclosure plate 112 and the positioning ridge 113 are fixedly connected to the base plate 111.

The base plate 111 is configured to connect with the screen protector assembly 20. During protector application, the base plate 111 is located above the device to be applied with the protector, and the screen protector assembly 20 is located between the base plate 111 and the device to be applied with the protector.

In a specific implementation process, the screen protector assembly 20 may be connected to the base plate 111 by means of bonding, magnetic attraction or the like.

The base plate 111 includes a base surface 1111, and the screen protector assembly 20 is fixedly connected to the base surface 1111. The base surface 1111 abuts against the screen protector assembly 20, that is, there is a plane-to-plane contact between the base surface 1111 and the screen protector assembly 20. Thus, the parallelism between the screen protector assembly 20 and the base surface 1111, and the stability of the connection between the screen protector assembly 20 and the protector applying member 11 can be ensured. During protector application, the base surface 1111 faces a side where the device to be applied with the protector is located.

Specifically, the base plate 111 may be in the shape of an arc-shaped flat plate, a right-angled flat plate or a rectangular flat plate, or the base plate may be a rectangular flat plate in the middle and bent at both ends to form an arc-shaped flat plate or a right-angled flat plate.

It can be understood that the shapes of the base surface 1111 and the base plate 111 are adapted to each other. For example, when the base plate 111 is in the shape of an arc-shaped flat plate, a right-angled flat plate, or a rectangular flat plate, correspondingly, the base surface 1111 is in the shape of an arc-shaped plane, a rectangular plane, or a rectangular plane.

In some other embodiments, the shape and structure of the base plate 111 can be set according to actual needs, and they are not limited to the above shapes and structures. For example, the base plate 111 may also be in the shape of a trapezoidal flat plate.

The enclosure plate 112 is plate-like. One end of the enclosure plate 112 is fixedly connected to the base plate 111, and the other end of the enclosure plate 112 extends along a direction the base surface 1111 faces, that is, the other end of the enclosure plate 112 extends toward the side where the device to be applied with the protector is located, so that during protector application, the enclosure plate 112 can abut against the side of the device to be applied with the protector, and be limited on the device to be applied with the protector. Thus, the screen protector assembly 20 connected to the base surface 1111 is limited, facilitating the alignment of the screen protector assembly 20 with the screen of the device to be applied with the protector.

The enclosure plate 112 is arranged along an outer side of the base plate 111. During protector application, an inner side of the base plate 111 is located directly above the device to be applied with the protector, and the outer side of the base plate 111 is directly opposite to the side of the device to be applied with the protector. Alternatively, the outer side of the base plate 111 protrudes directly above the device to be applied with the protector. The enclosure plate 112 is located outside directly above the device to be applied with the protector, and is directly opposite to the side of the device to be applied with the protector.

Optionally, the enclosure plate 112 is arranged to be perpendicular to the base surface 1111.

It can be understood that the enclosure plate 112 and the base surface 1111 may also be arranged to be non-perpendicular. For example, the enclosure plate 112 and the base surface 1111 are arranged at an obtuse angle or an acute angle. In addition, the enclosure plate 112 may also be arranged according to the radian of the side of the device to be applied with the protector in a thickness direction, that is, the other end of the enclosure plate 112 extends along the direction the base surface 1111 faces in accordance with the radian, so that the enclosure plate 112 can be attached to a side of the device to be applied with the protector in the thickness direction of the side.

The enclosure plate 112 includes a first limiting surface 1121, the first limiting surface 1121 is located on the inner side of the enclosure plate 112, and the first limiting surface 1121 is used to abut against the side of the device to be applied with the protector. During protector application, the first limiting surface 1121 faces the side of the device to be applied with the protector, and abuts against the side of the device to be applied with the protector.

Specifically, the enclosure plate 112 may be in the shape of an arc-shaped plate, a right angle or a rectangular flat plate, or the enclosure plate 112 may be a rectangular flat plate in the middle and bent at both ends to form an arc-shaped plate or a right angle. It can be understood that the shapes of the first limiting surface 1121 and the enclosure plate 112 are adapted to each other. For example, when the enclosure plate 112 is in the shape of an arc-shaped plate, a right angle, or a rectangular flat plate, correspondingly, the first limiting surface 1121 is an arc-shaped plane, two mutually perpendicular planes, or a rectangular plane.

In some other embodiments, the shape and structure of the enclosure plate 112 may be set according to actual needs, and are not limited to the above shapes and structures. For example, the enclosure plate 112 may also be in the shape of a trapezoidal plate.

The positioning ridge 113 is fixedly connected to the base plate 111, and the positioning ridge 113 is located on the inner side of the enclosure plate 112. With the base surface 1111 of the base plate 111 as a reference, a height of the enclosure plate 112 is greater than a height of the positioning ridge 113, and the positioning ridge 113 is used to abut against the screen of the device to be applied with the protector, so that a preset separation is maintained between the base surface 1111 and the screen, and the separation is used to accommodate the screen protector assembly 20. Therefore, when the positioning ridge 113 abuts against the screen, a preset gap is maintained between the screen protector assembly 20 and the screen to avoid the contact between the screen protector assembly 20 and the screen during the alignment process, thereby affecting the alignment.

The positioning ridge 113 includes a positioning surface 1131. The positioning surface 1131 is located on a side of the positioning ridge 113 facing away from the base surface 1111. The positioning surface 1131 is used to abut against the screen of the device to be applied with the protector, so that a preset separation between the base surface 1111 and the screen is maintained. During protector application, the positioning surface 1131 faces the screen of the device to be applied with the protector.

Optionally, the positioning ridge 113 further includes a second limiting surface 1132. The second limiting surface 1132 is located on the other side of the positioning ridge 113 away from the enclosure plate 112. The second limiting surface 1132 is used to abut against the side of the he screen protector assembly 20, so that the screen protector assembly 20 is limited to the protector applying member 11 to position the screen protector assembly 20 on the protector applying member 11. During protector application, the second limiting surface 1132 faces the side of the screen protector assembly 20. Of course, the screen protector assembly 20 may also be positioned on the protector applying member 11 in other ways, for example, through a boss of a first matching member and a positioning hole 1301 of a partition 13 as described below.

The separation between the positioning surface 1131 and the base surface 1111 is greater than the thickness of the screen protector assembly 20. Thus, after the screen protector assembly 20 is connected to the base surface 1111, there is a height difference between the side of the screen protector assembly 20 facing away from the base surface 1111 and the positioning surface 1131 to ensure that a preset gap can be reserved between the screen protector assembly 20 and the screen of the device to be applied with the protector during protector application.

Optionally, the positioning ridge 113 is arranged along the first limiting surface 1121, and the shapes of the first limiting surface 1121 and the second limiting surface 1132 are adapted to each other, that is, with a plane parallel to the base surface 1111 as a cross section, the line shapes presented by the cross sections of the first limiting surface 1121 and the second limiting surface 1132 are adapted to each other. It can be understood that, generally, the shapes of the sides of the screen protector assembly 20 and of the screen of the device to be applied with the protector are adapted to each other, and the shapes of the positioning ridge 113 and the enclosure plate 112 are set as an adapted structure, so that when the first limiting surface 1121 abuts against a side of the device to be applied with the protector, the screen protector assembly 20 limited by the second limiting surface 1132 can be located directly above the screen accordingly, facilitating the alignment of the screen protector assembly 20 and the screen.

Specifically, the positioning ridge 113 may be in the shape of an arc-shaped strip, an L-shaped strip, or a rectangular strip, or the positioning ridge 113 may be a rectangular strip in the middle and bent at both ends to form an arc-shaped strip or an L-shaped strip. It can be understood that the shapes of the second limiting surface 1132 and the positioning ridge 113 are adapted to each other. For example, when the positioning ridge 113 is in the shape of an arc-shaped strip, an L-shaped strip, or a rectangular strip, correspondingly, the second limiting surface 1132 is an arc-shaped surface, two mutually perpendicular planes, or a rectangular plane.

Figure 3:
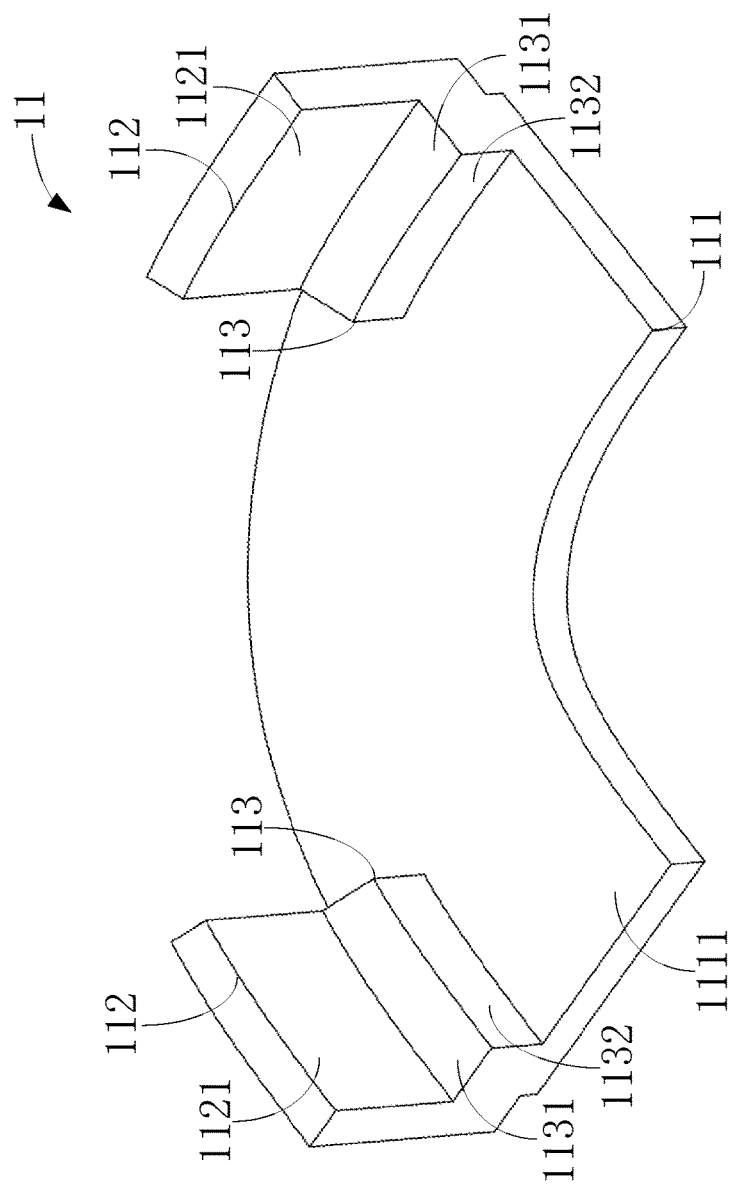
FIG. 3 is a schematic structural view of a protector applying member of a protector applying assembly provided in another embodiment of the present disclosure.

It can be understood that, in each protector applying member 11, the enclosure plate 112 and/or the positioning ridge 113 may be continuously arranged on the base plate 111, that is, the cross section(s) of the enclosure plate 112 and/or the positioning ridge 113 are/is in a continuous plane. For example, the enclosure plate 112 extends continuously from one end of the base plate 111 to the other end of the base plate 111, and the positioning ridge 113 also extends continuously from one end of the base plate 111 to the other end of the base plate 111, as shown in FIG. 2. In some other embodiments, in each protector applying member 11, the enclosure plate 112 and/or the positioning ridge 113 are arranged in sections on the base plate 111, that is, the cross section(s) of the enclosure plate 112 and/or the positioning ridge 113 are/is segmented. For example, both the number of enclosure plates 112 and the number of positioning ridges 113 are two. The two enclosure plates 112 are arranged on both ends of the base plate 111, respectively. The two enclosure plates 112 are separated by a first preset distance. The two positioning ridges 113 are also arranged at both ends of the base plate 111, respectively. The two positioning ridges 113 are separated by a second preset distance. The first preset distance and the second preset distance may be equal or unequal. As shown in FIG. 3, FIG. 3 is a schematic structural view of a protector applying member 11 of a protector applying assembly 10 provided in another embodiment of the present disclosure.

In a specific implementation process, the base plate 111, the enclosure plate 112 and the positioning ridge 113 are integrally formed.

In this embodiment, the number of protector applying members 11 is at least two, and the protector applying members 11 are independent of each other. Two or more protector applying members 11 can better limit and support the screen protector assembly 20, which is helpful to align the screen protector assembly 20 with the screen, facilitating protector application.

As shown in FIG. 1, each protector applying member 11 is arc-shaped as a whole, that is, the protector applying members 11 are arranged along the corners of the device to be applied with the protector. The first limiting surface 1121 is an arc-shaped surface, and the first limiting surface 1121 is adapted to the sides at a corner of the device to be applied with the protector. Before protector application, the corners of the screen protector assembly 20 are connected to the base surfaces 1111 of the protector applying members 11, and the protector applying members 11 are placed at the corners of the device to be applied with the protector. When both ends of the first limiting surface 1121 in an arc line direction abut against a long side and a short side at a corner of the device to be applied with the protector, respectively, the quick alignment of the screen protector assembly 20 and the screen can be realized.

Optionally, the second limiting surface 1132 is an arc-shaped surface, and the second limiting surface 1132 is adapted to the sides at the corner of the screen protector assembly 20. During Before protector application, the sides at the corners of the screen protector assembly 20 abut against the second limiting surfaces 1132, so that the screen protector assembly 20 is limited to the protector applying members 11, so as to position the screen protector assembly 20 on the protector applying members 11, facilitating the quick alignment of the screen protector assembly 20 and the screen.

In this embodiment, the number of protector applying members 11 is four, and the four protector applying members 11 are used to be placed on the four corners of the device to be applied with the protector, respectively. Before protector application, the four corners of the screen protector assembly 20 are connected to the base surfaces 1111 of the four protector applying members 11, respectively, and the four protector applying members 11 are placed at the four corners of the device to be applied with the protector, respectively. When the positioning surfaces 1131 of the four protector applying members 11 abut against the tops of the four corners of the device to be applied with the protector, respectively, the four protector applying members 11 can support the entire screen protector assembly 20, preventing the screen protector assembly 20 from being recessed toward the screen of the device to be applied with the protector under the action of its own gravity during the alignment process, thereby affecting the alignment.

Figure 4:
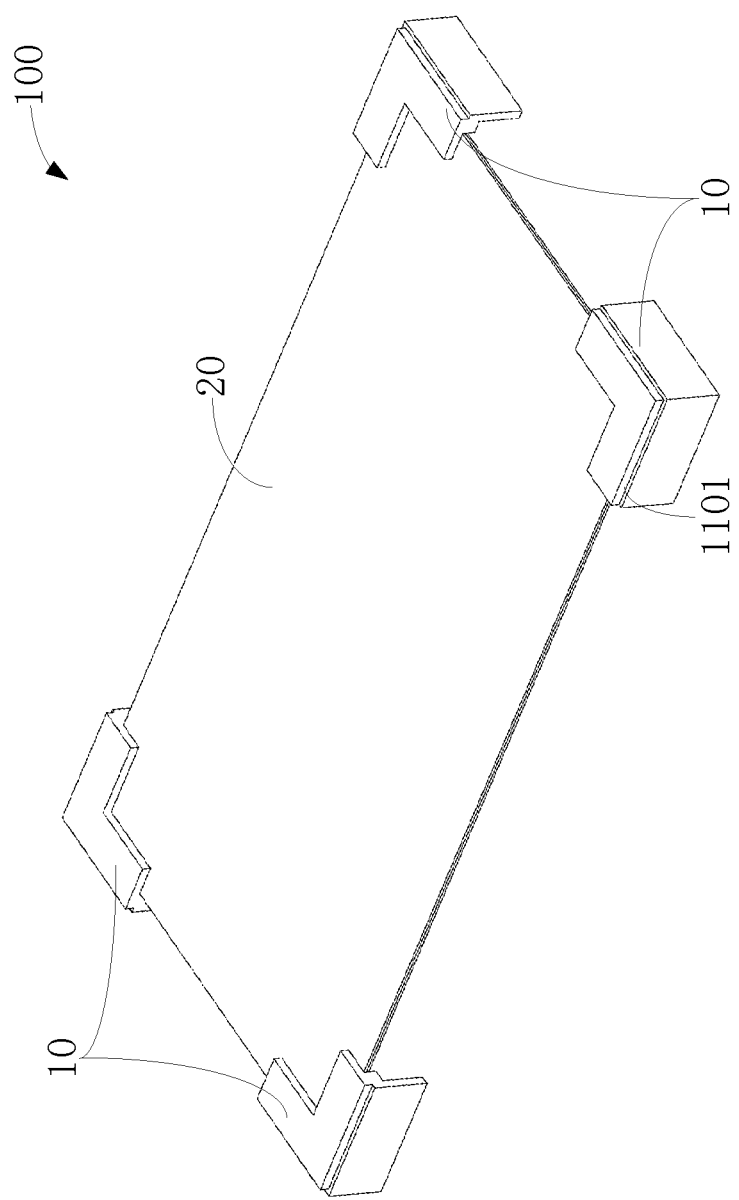
FIG. 4 is a schematic structural view of a screen protector applicator provided in still another embodiment of the present disclosure.

Referring to FIG. 4, FIG. 4 is a schematic structural view of a screen protector applicator 100 provided in another embodiment of the present disclosure. The embodiment shown in FIG. 4 is similar to the embodiment shown in FIG. 2, except that each protector applying member 11 is in the shape of a right angle as a whole. The first limiting surface 1121 includes two mutually perpendicular planes. Such an arrangement can make the protector applying member 11 of this embodiment adaptable to various devices to be applied with different corner radians, improving the adaptability of the protector applying member 11.

Optionally, the second limiting surface 1132 also includes two mutually perpendicular planes. Such an arrangement can make the protector applying member 11 of this embodiment adaptable to various screen protector assemblies 20 with different corner radians, improving the adaptability of the protector applying member 11.

In this embodiment, the number of protector applying members 11 is four, and the four protector applying members 11 are used to be placed on the four corners of the device to be applied with the protector, respectively.

In some other embodiments, the number of the protector applying members 11 in the embodiments shown in FIGS. 1 and 4 may also be selected according to actual needs. For example, two protector applying members 11 are diagonally distributed on two corners of the device to be applied with the protector. In addition, both ends of the protector applying member 11 can extend to a sufficient length along a side of the device to be applied with the protector to ensure that the two protector applying members 11 support the entire screen protector assembly 20. For example, one end of the protector applying member 11 extends along a long side of the device to be applied with the protector to the middle of the long side, and the other end of the protector applying member 11 extends along a short side of the device to be applied with the protector to the middle of the short side.

Figure 5:
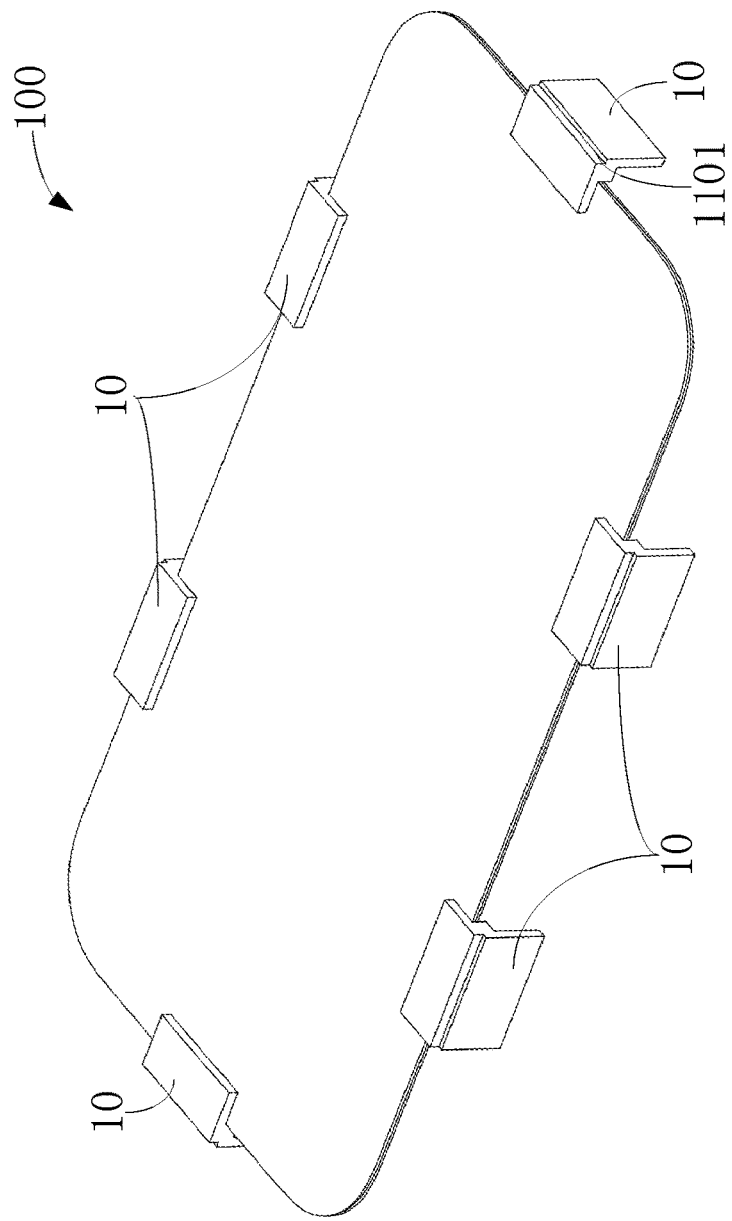
FIG. 5 is a schematic structural view of a screen protector applicator provided in another embodiment of the present disclosure.

Referring to FIG. 5, FIG. 5 is a schematic structural view of a screen protector applicator 100 provided in another embodiment of the present disclosure. Each protector applying member 11 is long and straight as a whole, that is, the protector applying members 11 are arranged along the sides of the device to be applied with the protector. The first limiting surface 1121 is a rectangular plane. During protector application, the protector applying member 11 is placed on the long side or the short side of the device to be applied with the protector.

Optionally, the second limiting surface 1132 is a rectangular plane. During protector application, the sides of the screen protector assembly 20 abuts against the second limiting surfaces 1132, so that the screen protector assembly 20 is limited to the protector applying members 11, so as to position the screen protector assembly 20 on the protector applying member 11, facilitating the quick alignment of the screen protector assembly 20 and the screen.

The number of protector applying members 11 is at least four, and the protector applying members 11 are used to be placed on four sides or two opposite sides of the device to be applied with the protector. The two opposite sides may be two opposite long sides of the device to be applied with the protector, or two opposite short sides of the device to be applied with the protector.

In this embodiment, before protector application, the four sides of the screen protector assembly 20 are connected to the base surfaces 1111 of the at least four protector applying members 11, respectively, and the at least four protector applying members 11 are placed on the four sides of the device to be applied with the protector, respectively. When the positioning surfaces 1131 of the at least four protector applying members 11 abut against the tops of the four sides of the device to be applied with the protector, respectively, the at least four protector applying members 11 can support the entire screen protector assembly 20, preventing the screen protector assembly 20 from being recessed toward the screen of the device to be applied with the protector under the action of its own gravity during the alignment process, thereby affecting the alignment.

Figure 6:
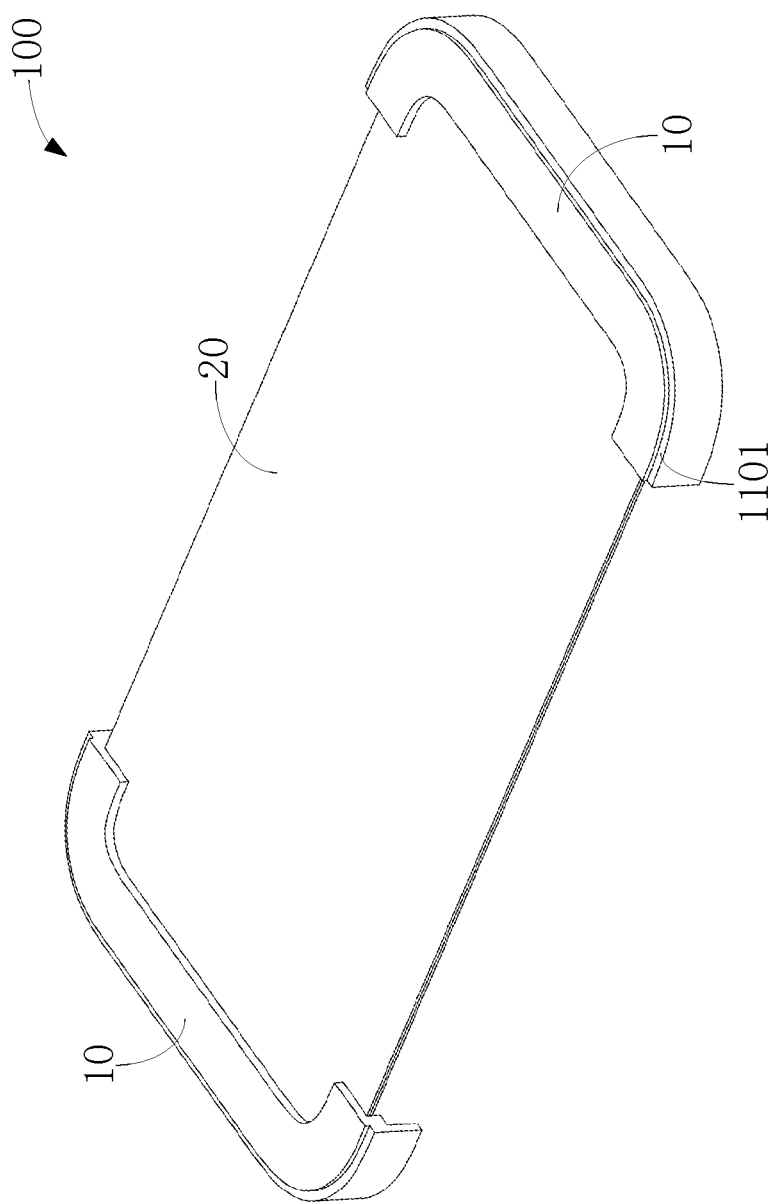
FIG. 6 is a schematic structural view of a screen protector applicator provided in another embodiment of the present disclosure.

Referring to FIG. 6, FIG. 6 is a schematic structural view of a screen protector applicator 100 provided in another embodiment of the present disclosure. Each protector applying member 11 is long and straight in the middle, and is bent on both ends to form an arc or a right angle. That is, the protector applying member 11 is arranged along one side of the device to be applied with the protector and two corners of the one side of the device to be applied with the protector. During protector application, one side of the screen protector assembly 20 is connected to the base surface 1111 of the protector applying member 11, the protector applying member 11 is placed on one side of the device to be applied with the protector, the middle part of the first limiting surface 1121 is opposite to one side of the device to be applied with the protector, and both ends of the first limiting surface 1121 are opposite to the two corners on the one side of the device to be applied with the protector, respectively. When the first limiting surface 1121 abuts against one side of the device to be applied with the protector and the two corners of the one side of the device to be applied with the protector, the quick alignment of the screen protector assembly 20 and the screen can be realized.

Optionally, during protector application, both ends of the second limiting surface 1132 are opposite to the two corners on one side of the screen protector assembly 20, respectively. When the second limiting surface 1132 abuts against one side of the screen protector assembly 20 and the two corners on the one side of the screen protector assembly 20, the screen protector assembly 20 is limited to the protector applying members 11, so as to position the screen protector assembly 20 on the protector applying members 11, facilitating the quick alignment of the screen protector assembly 20 and the screen.

In this embodiment, the number of the protector applying members 11 is two, and the two protector applying members 11 are used to be symmetrically placed on the long side or the short side of the device to be applied with the protector. During protector application, the two opposite sides of the screen protector assembly 20 are connected to the base surfaces 1111 of the two protector applying members 11, respectively, and the two protector applying members 11 are placed on two opposite sides of the device to be applied with the protector, respectively. When the positioning surfaces 1131 of the two protector applying members 11 abut against the tops of the two opposite sides of the device to be applied with the protector, respectively, the two protector applying members 11 can support the entire screen protector assembly 20, preventing the screen protector assembly 20 from partly falling to the screen of the device to be applied with the protector under the action of its own gravity during the alignment process, thereby affecting the alignment.

The outer side of the protector applying member 11 is provided with a stepped portion 1101, and the stepped portion 1101 is located at one end of the enclosure plate 112 close to the base plate 111. The stepped portion 1101 is used to cooperate with the other end of the enclosure plate 112 of another protector applying member 11, so as to improve the degree of fit of two protector applying members 11 when stacked, which is helpful to stack and store the protector applying members 11 more stably.

Figure 7:
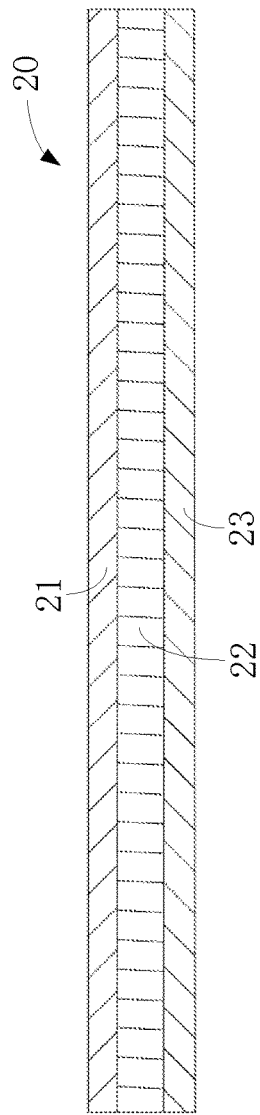
FIG. 7 is a schematic cross-sectional view of a screen protector assembly of a screen protector applicator according to an embodiment of the present disclosure.

Referring to FIG. 7, FIG. 7 is a schematic cross-sectional view of a screen protector assembly 20 of a screen protector applicator 100 according to an embodiment of the present disclosure. The screen protector assembly 20 includes a retention layer 21, a screen protector layer 22 and a cover layer 23. The retention layer 21 and the cover layer 23 are attached to opposite sides of the screen protector layer 22, respectively, and the retention layer 21 is used to be connected to a base surface 1111, so that the screen protector assembly 20 is integrally fixed on a protector applying member 11. The screen protector layer 22 is used to be attached to a screen of a to-be-applied device, and the cover layer 23 is used to provide protection for the screen protector layer 22 to shield the outside world before protector application. Before the screen protector layer 22 is aligned with the screen, the cover layer 23 needs to be peeled off.

Specifically, the screen protector layer 22 has a certain rigidity, the bonding strength between the retention layer 21 and the base surface 1111 is greater than the bonding strength between the retention layer 21 and the screen protector layer 22, and the bonding strength between the screen protector layer 22 and the screen is greater than the bonding strength between the screen protector layer 22 and the retention layer 21, which can facilitate the peeling of the retention layer 21 from the screen protector layer 22 during a process of bonding the screen protector layer 22 to the screen.

Protector application steps of the screen protector applicator 100 are exemplified by taking the screen protector applicator 100 of the embodiment shown in FIG. 1 as an example.

The cover layer 23 is peeled off from the screen protector layer 22 before the screen protector layer 22 is aligned with the screen.

Then, the screen protector layer 22 is aligned with the screen of the device to be applied with the protector by protector applying members 11. Specifically, four protector applying members 11 are snapped onto four corners of the device to be applied with the protector. At this time, enclosure plates 112 of the four protector applying members 11 are opposite to the four corners, respectively, and the enclosure plates 112 of the four protector applying members 11 limit the screen protector assembly 20 through the four corners, so that the screen protector layer 22 is directly facing the top of the screen of the device to be applied with the protector. Meanwhile, positioning ridges 113 of the four protector applying members 11 abut against a side where the screen of the device to be applied with the protector is located, so that a preset gap is maintained between the screen protector layer 22 and the screen.

Then, in the middle of one end of the screen protector assembly 20, the screen protector assembly 20 is pressed, the pressed part of the screen protector assembly 20 is recessed toward the screen causing the screen protector layer 22 to partially separate from the retention layer 21. At the same time, the part of the screen protector layer 22 recessed toward the screen begins bonding to the screen. Under the action of the adhesion force and the own gravity of the screen protector layer 22, the screen protector layer 22 is slowly attached to the screen along a direction toward the other end of the screen protector assembly 20. Meanwhile, the air between the screen protector layer 22 and the screen is evacuated, so as to prevent air bubbles from generating between the screen protector layer 22 and the screen until it is attached to the middle of the screen protector layer 22. Since the other end of the screen protector assembly 20 is supported on the base surface 1111, and the adhesion force and the own gravity of the screen protector layer 22 cannot overcome the supporting force of the base surface 1111 to the screen protector assembly 20 to do work, the screen protector layer 22 stops bonding to the screen, and a certain gap is maintained between the other end of the screen protector layer 22 and the screen. It should be noted that, during the above process, the retention layer 21 is always connected to the base surface 1111.

Finally, the protector applying member 11 is lifted at one end of the screen protector assembly 20, and the protector applying member 11 drives the retention layer 21 to be peeled off from the screen protector layer 22. Since the supporting force of the base surface 1111 on the other end of the screen protector layer 22 disappears, under the action of the adhesion force and the own gravity of the screen protector layer 22, the screen protector layer 22 continues to be attached to the screen slowly along a direction toward the other end of the screen protector assembly 20. At the same time, the air between the screen protector layer 22 and the screen is evacuated until the screen protector layer 22 is completely bonded to the screen.

Figure 8:
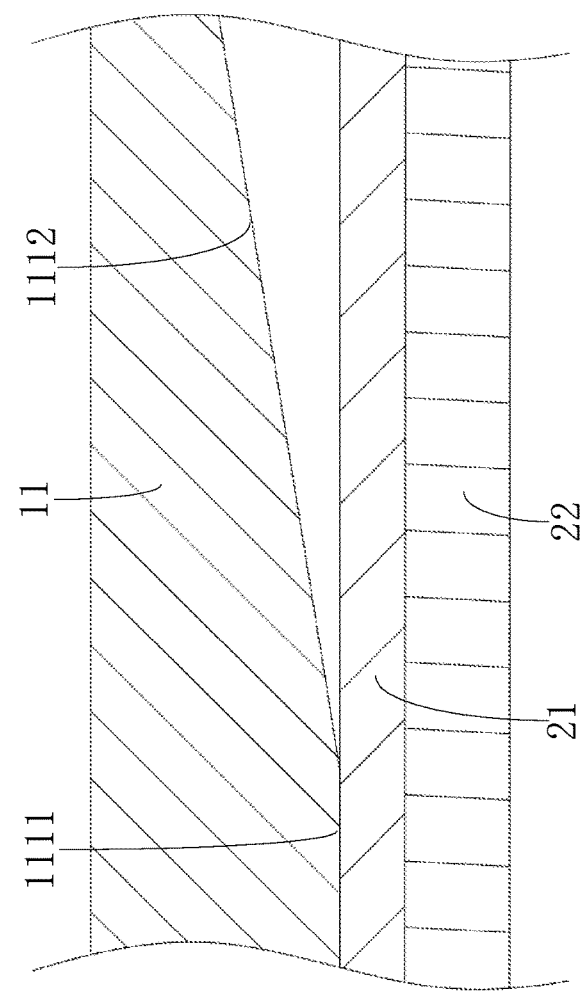
FIG. 8 is a schematic cross-sectional view of cooperation between a protector applying member and a screen protector assembly provided in another embodiment of the present invention.
Figure 9:
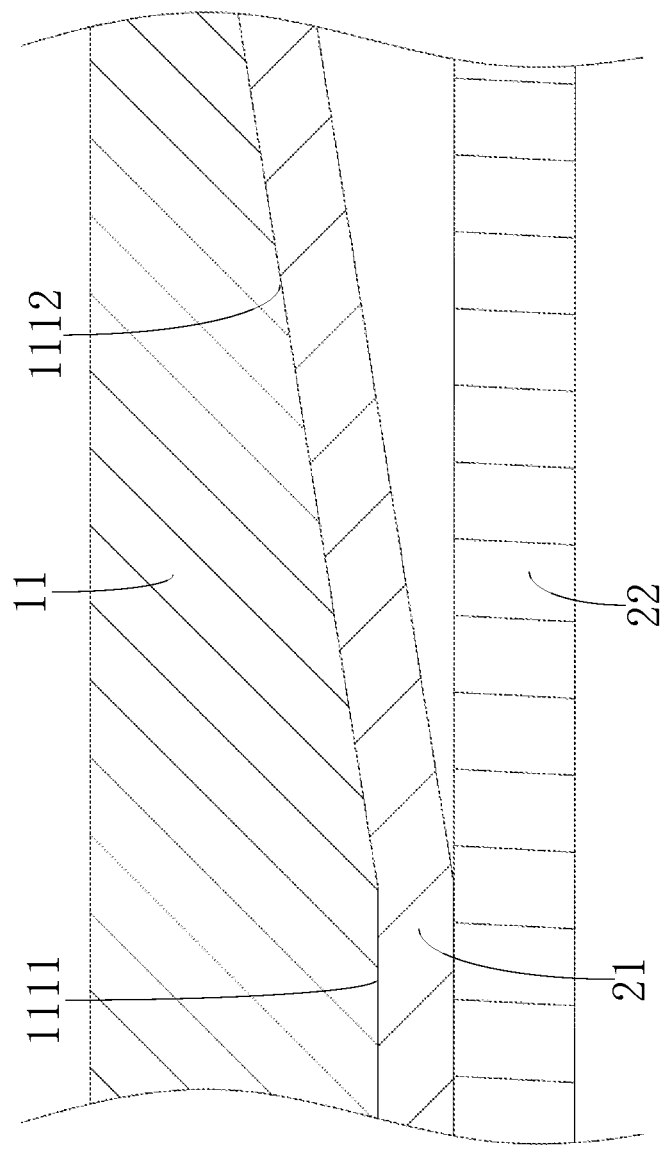
FIG. 9 is a schematic cross-sectional view of a changing state of cooperation between the protector applying member and the screen protector assembly shown in FIG. 8.

Referring to FIGS. 8 and 9, FIG. 8 is a schematic cross-sectional view of cooperation of a protector applying member 11 and a screen protector assembly 20 provided in another embodiment of the present disclosure, and FIG. 9 is a schematic cross-sectional view of a changing state of the cooperation of the protector applying member 11 and the screen protector assembly 20 as shown in FIG. 8. The base plate 111 also includes an inclined surface 1112. The inclined surface 1112 is connected to the base surface 1111, the inclined surface 1112 is closer to the positioning ridge 113 than the base surface 1111, and the inclined surface 1112 and the base surface 1111 are arranged at a preset angle, so that the inclined surface 1112 can be recessed into the base plate 111 at a preset inclination angle relative to the base surface 1111. The screen protector layer 22 of the screen protector assembly 20 abuts against the base surface 1111 in a plane-to-plane manner and is fixed thereto. At this time, the corners or sides of the screen protector assembly 20 are opposite to the base surface 1111 and the inclined surface 1112. Then, parts of the corners or the sides opposite to the inclined surface 1112 are pressed toward the inclined surface 1112, wherein the bonding strength of the retention layer 21 and the inclined surface 1112 is greater than the bonding strength of the retention layer 21 and the screen protector layer 22. Moreover, because the screen protector layer 22 has certain rigidity, after the part of the retention layer 21 is warped to the inclined surface 1112 and bonded to the inclined surface 1112, the part of the screen protector layer 22 is separated from the part of the retention layer 21 and returns to the shape before being pressed.

Specifically, one end of the inclined surface 1112 is connected to the base surface 1111, and the other end of the inclined surface 1112 extends obliquely upward at a preset angle.

In some other embodiments, the inclined surface 1112 may be omitted.

In the protector applying assembly 10 of the embodiment of the present disclosure, the enclosure plate 112 of the protector applying member 11 can abut against the side of the device to be applied with the protector, so as to limit the position of the screen protector assembly 20 connected to the base surface 1111, facilitating the alignment of the screen protector assembly 20 and the screen of the device to be applied with the protector. The positioning ridge 113 of the protector applying member 11 can maintain a preset separation between the base surface 1111 and the screen, and the separation can accommodate the screen protector assembly 20, so as to allow to maintain a preset gap between the screen protector assembly 20 and the screen when the positioning ridge 113 abuts against the screen, avoiding the mutual contact between the screen protector assembly 20 and the screen during the alignment process and affecting the alignment. In addition, the number of protector applying members 11 is at least two, and the protector applying members 11 are independent of each other. Two or more protector applying members 11 can better limit and support the screen protector assembly 20, which is helpful to align the screen protector assembly 20 with the screen, facilitating protector application.

The protector applying assembly 10 of the embodiment of the present disclosure has a simple structure, and when the protector applying assembly 10 is used to perform protector application, the operation is convenient, and it has limiting and alignment functions, so that the protector application efficiency and quality are improved.

Figure 10A:
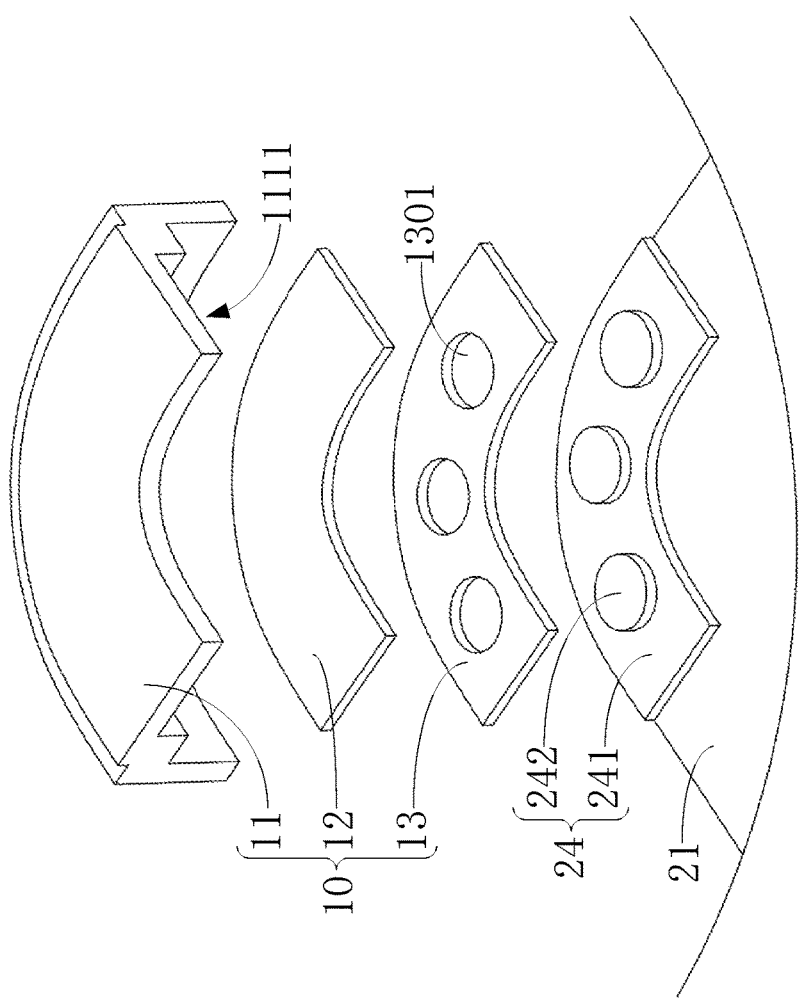
FIG. 10A is a schematic structural view of a screen protector applicator provided in another embodiment of the present disclosure.

FIG. 10A is a schematic structural view of a screen protector applicator 100 provided in another embodiment of the present disclosure. In this embodiment, the screen protector assembly 20 also includes a first matching member 24. The first matching member 24 is fixedly connected to the retention layer 21, and the first matching member 24 is used to be detachably connected to the protector applying assembly 10, so that the retention layer 21 is detachably fixed on the protector applying assembly 10.

In the screen protector assembly 20 in this embodiment, by setting the first matching member 24 detachably connected to the protector applying assembly 10, it is allowed to detach the retention layer 21 from the protector applying assembly 10 after the protector is applied to the screen, thereby allowing the protector applying assembly 10 to be reused, and saving costs. The first matching member 24 is detachably connected to the protector applying assembly 10, which can avoid affecting the flatness of the connection between the retention layer 21 and the protector applying assembly 10 when removing the retention layer 21 from the protector applying assembly 10, thereby avoiding affecting the parallelism of the screen protector assembly 20 relative to the screen of the device to be applied with the protector.

In this embodiment, the number of first matching members 24 is at least two, the first matching members 24 are independent of each other, and the first matching members 24 is separately fixedly connected to the retention layer 21. Two or more mutually independent first matching members 24 can better support the screen protector assembly 20 and strengthen the connection between the retention layer 21 and the protector applying assembly 10.

Each first matching member 24 is a first magnetic attraction member, and the first magnetic attraction member has a magnetic attraction function, so that the first magnetic attraction member and the protector applying assembly 10 magnetically attract each other, so as to detachably fix the retention layer 21 to the protector applying assembly 10. This mutual fixing assembly method through magnetic attraction improves the disassembly and assembly efficiency of the screen protector assembly 20 and the protector applying assembly 10, and its structure is simple and easy to operate.

When assembling, it is only necessary to make the first matching member 24 and the protector applying assembly 10 close to each other for magnetic attraction cooperation, so that the entire screen protector assembly 20 can be fixed on the protector applying assembly 10. When disassembling, it is only necessary to overcome the magnetic attraction force to make the first matching member 24 and the protector applying assembly 10 separated from each other, so that the entire screen protector assembly 20 is disassembled from the protector applying assembly 10.

The first matching member 24 includes a fixing plate 241 fixedly connected to the retention layer 21, and the fixing plate 241 or the boss 242 is used to attract the protector applying assembly 10.

The fixing plate 241 is arc-shaped or right-angled, and the fixing plate 241 is located at the corner of the retention layer 21. Both ends of the fixing plate 241 are arranged along the corners of the retention layer 21, respectively. In this way, when the first matching member 24 is connected to the protector applying assembly 10, the first matching member 24 can better support the retention layer 21 at the corner of the retention layer 21. Alternatively, the fixing plate 241 may be prismatic and located at an edge of the retention layer 21.

The first matching member 24 further includes a boss 242. The boss 242 is fixedly connected to the fixing plate 241, and the boss 242 is used for positioning on the protector applying assembly 10. The boss 242 is provided so that when the first matching member 24 is assembled with the protector applying assembly 10, quick positioning can be realized and the assembly efficiency can be improved.

In an embodiment, the number of the first matching members 24 is four, and the four first matching members 24 are distributed on four corners of the retention layer 21. Thus, when the four first matching members 24 are matched with the screen protector assembly 20, respectively, the four first matching members 24 can support the entire screen protector assembly 20.

In this embodiment, the protector applying assembly 10 further includes a second matching member 12, the second matching member 12 is fixedly connected to the protector applying member 11, and the first matching member 24 is detachably connected to the second matching member 12, so that the retention layer 21 is detachably fixed to the protector applying assembly 10.

In the protector applying assembly 10 of this embodiment, by setting the second matching member 12 detachably connected to the first matching member 24 of the screen protector assembly 20, the detachable connection between the retention layer 21 of the screen protector assembly 20 and the protector applying assembly 10 is realized, which allows the protector applying assembly 10 to be reused after the retention layer 21 is detached from the protector applying assembly 10. The same protector applying assembly 10 can be connected to different screen protector assemblies 20, thereby saving costs. Moreover, the retention layer 21 is detachably connected to the protector applying assembly 10 through the first matching member 24 and the second matching member 12, which can avoid affecting the flatness of the connection between the retention layer 21 and the protector applying assembly 10 when the protector layer is disassembled from the protector applying assembly, thereby affecting the parallelism of the screen protector assembly 20 relative to the screen of the device to be applied with the protector.

In this embodiment, both the number of protector applying members 11 and the number of second matching members 12 are at least two. The protector applying members 11 are independent of each other, and the second matching members 12 are independent of each other. Each second matching member 12 is fixedly connected to a corresponding protector applying member 11, and each first matching member 24 is detachably connected to a corresponding second matching member 12. The number of first matching members 24 is also at least two, and the first matching members 24 are independent of each other. The first matching members 24 are separately fixedly connected to the retention layer 21, and one first matching member 24 corresponds to one protector applying member 11 and one second matching member 12. In this way, the screen protector assembly 20 is better supported, and the connection between the retention layer 21 and the protector applying assembly 10 is strengthened.

The second matching member 12 is a second magnetic attraction member, and the first magnetic attraction member and the second magnetic attraction member can attract each other, so that the retention layer 21 is detachably fixed to the protector applying assembly 10.

The first matching member 24 is ferromagnetic, and the second matching member 12 is a magnet, so that the first matching member 24 can be allowed to be designed as a special-shaped structure as a whole, such as the above-mentioned structure of the fixing plate 241 plus the boss 242. Moreover, the cost of the magnet is high, and it is arranged on the protector applying member 11 as a reusable member, which is helpful to reduce the cost.

In some other embodiments, the first matching member 24 and the second matching member 12 are magnetic attraction members with opposite magnetism.

The protector applying assembly 10 also includes at least two mutually independent partitions 13. Each partition 13 is connected to a corresponding protector applying member 11, and each partition 13 is located between a corresponding first matching member 24 and a corresponding second matching member 12. Each partition 13 is provided with a positioning hole 1301, and the positioning hole 1301 is used for positioning the first matching member 24, for example, through the boss 242. The partition 13 may have multiple positioning holes 1301 and the second matching member 12 may have discrete portions positionally corresponding to the multiple positioning holes 1301. For example, the second matching member 12 has multiple discrete disk-shaped portions each within the footprints the multiple positioning holes 1301.

The partition 13 may be made of non-magnetic material, such as plastic.

The positioning hole 1301 runs through the partition 13, and the boss 242 of the first matching member 24 extends into the positioning hole 1301 of the partition 13, so as to realize the mutual positioning between the first matching member 24 and the second matching member 12. When the boss 242 extends into the positioning hole 1301 of the partition 13, it can abut against the second matching member 12 to enhance the magnetic attraction between the first matching member 24 and the second matching member 12, so that the retention layer 21 is firmly connected to the protector applying assembly 10.

Specifically, the second matching member 12 is fixedly connected to the base surface 1111 of the base plate 111 of a corresponding protector applying member 11. The second matching member 12 may be in a shape adapted to the fixing plate 241 of the first matching member 24, that is, the second matching member 12 may be in the shape of an arc-shaped plate or a right-angle plate. In addition, the partition 13 is also in a shape adapted to the fixing plate 241 of the first matching member 24, that is, the partition 13 is also in the shape of an arc-shaped plate or a right-angle plate.

It can be understood that, in some other embodiments, the first matching member 24, the second matching member 12 and the partition 13 may also have other shapes and structures. For example, the first matching member 24, the second matching member 12 and the partition 13 are all in the shape of a rectangular plate.

Optionally, the first matching member 24, the partition 13, the second matching member 12 and the base surface 1111 are arranged in parallel.

In this embodiment, the number of the at least two first matching members 24, the number of the at least two protector applying members 11 and the number of the at least two second matching members 12 are all four, one first matching member 24 corresponds to one protector applying member 11 and one second matching member 12, the four first matching members 24 are distributed on the four corners of the retention layer 21, and the four protector applying members 11 are used to be placed on the four corners of the device to be applied with the protector, respectively, so that when the four first matching members 24 cooperate with the four second matching members 12, respectively, they can support the entire screen protector assembly 20.

In some other embodiments, the number of the at least two first matching members 24, the number of the at least two protector applying members 11 and the number of the at least two second matching members 12 can be selected according to actual needs, as long as they are each at least two, and one first matching member 24 corresponds to one protector applying member 11 and one second matching member 12. For example, the number of the at least two first matching members 24, the number of the at least two protector applying members 11 and the number of the at least two second matching members 12 are each six.

Figure 10B:
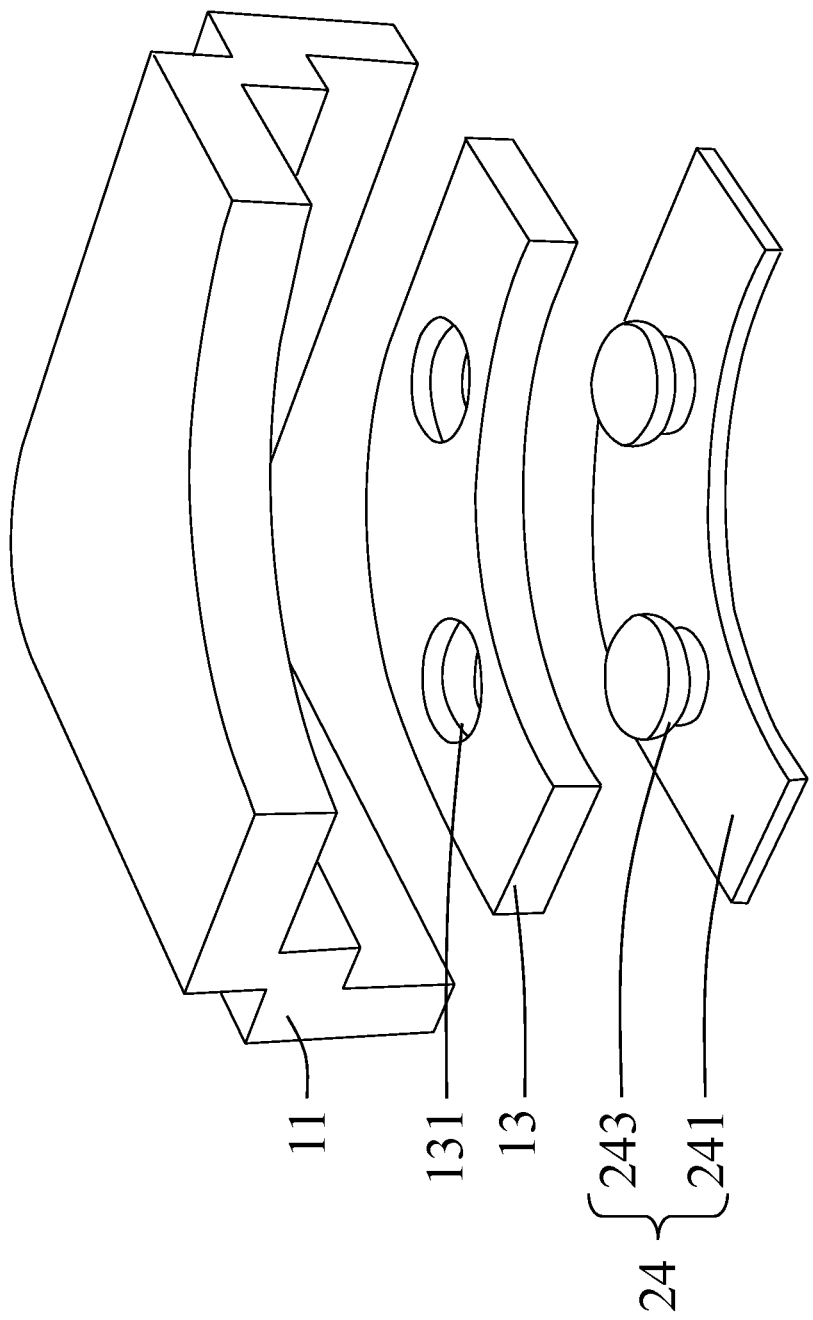
FIG. 10B and FIG. 10C are schematic structural views of a screen protector applicator provided in another embodiment of the present disclosure.
Figure 10C:
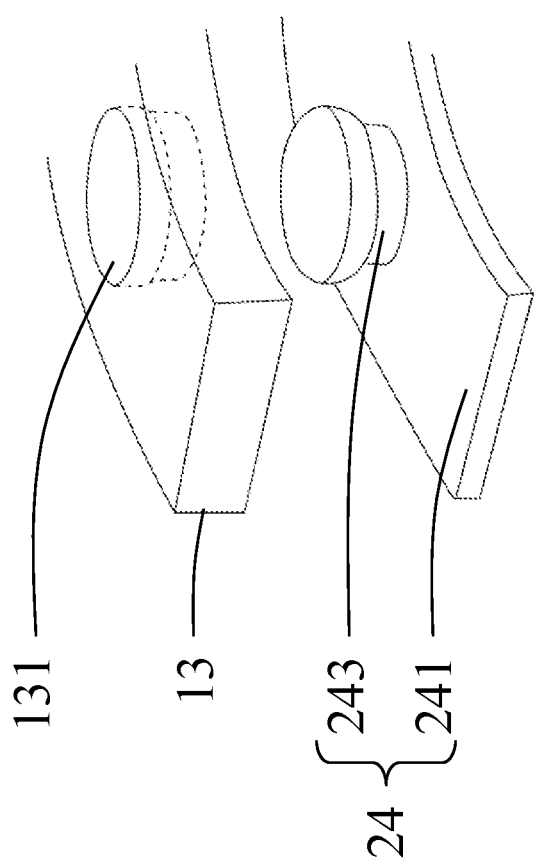

In some other embodiments, the first matching member 24 may also be detachably connected to the protector applying assembly 10 in other ways, such as using a snap fit. Specifically, as shown in FIG. 10B and FIG. 10C, the first matching member 24 has a ball 243, and the partition 13 has a socket 131, or vice versa. When assembling, the ball is pushed into the socket, thereby forming a snap fit.

Figure 11:
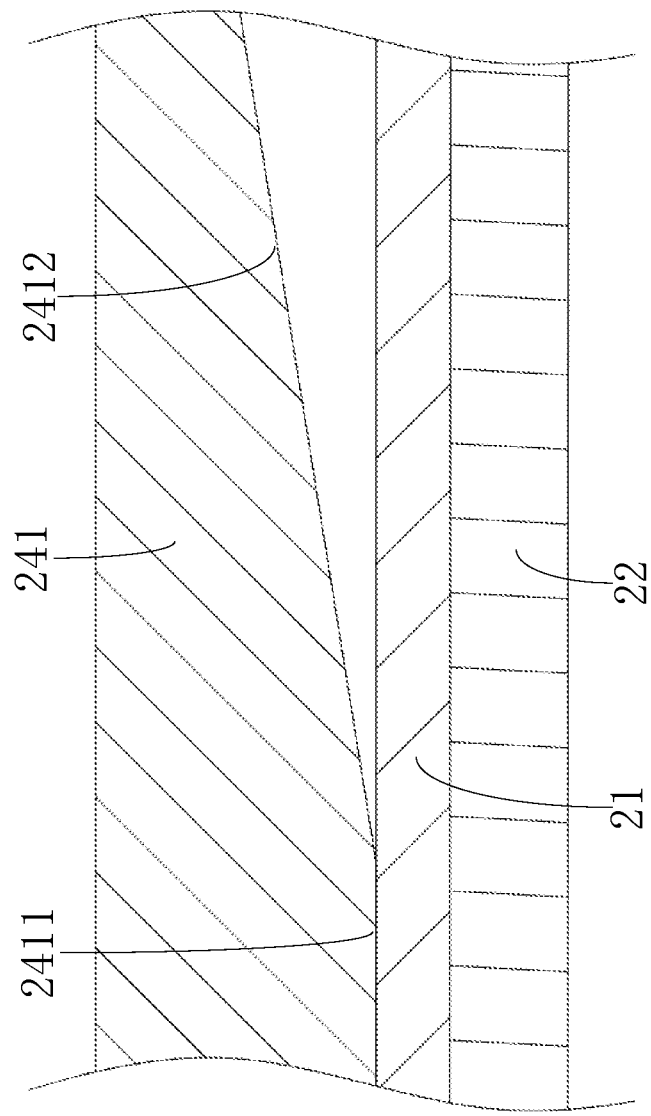
FIG. 11 is a schematic cross-sectional view of cooperation of a retention layer, a screen protector layer and a fixing plate of a screen protector assembly provided in another embodiment of the present disclosure.
Figure 12:
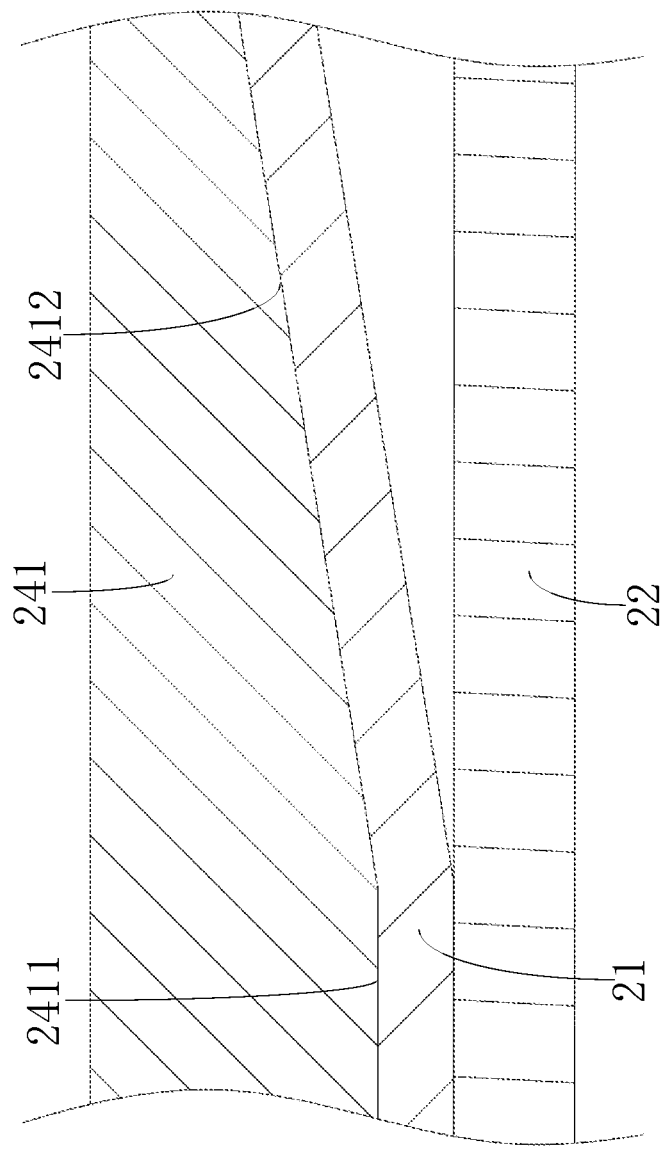
FIG. 12 is a schematic cross-sectional view of the cooperation of the retention layer, the screen protector layer and the fixing plate shown in FIG. 11.

Referring to FIGS. 11 and 12, FIG. 11 is a schematic cross-sectional view of cooperation of the retention layer 21, the screen protector layer 22 and the fixing plate 241 of the screen protector assembly 20 provided in another embodiment of the present disclosure, and FIG. 12 is a schematic cross-sectional view of a changing state of the cooperation of the retention layer 21, the screen protector layer 22 and the fixing plate 241 as shown in FIG. 11. The fixing plate 241 includes a first fixing surface 2411 and a second fixing surface 2412. The first fixing surface 2411 and the second fixing surface 2412 are opposite to the retention layer 21. The first fixing surface 2411 is connected to the second fixing surface 2412. The second fixing surface 2412 is farther away from the middle of the retention layer 21 than the first fixing surface 2411, the first fixing surface 2411 is arranged parallel to the retention layer 21, and the second fixing surface 2412 and the first fixing surface 2411 are arranged at a preset angle, so that the second fixing surface 2412 can be recessed into the fixing plate 241 at a preset angle of inclination relative to the first fixing surface 2411, and the first fixing surface 2411 is fixedly connected to the retention layer 21. The screen protector layer 22 of the screen protector assembly 20 abuts against the first fixing surface 2411 in a plane-to-plane manner and is fixed thereto. At this time, the corners or sides of the screen protector assembly 20 are opposite to the first fixing surface 2411 and the second fixing surface 2412. Then, parts of the corners or the sides opposite to the second fixing surface 2412 are pressed toward the second fixing surface 2412, wherein the bonding strength of the retention layer 21 and the second fixing surface 2412 is greater than the bonding strength of the retention layer 21 and the screen protector layer 22. Moreover, since the screen protector layer 22 itself has certain rigidity, the part of the retention layer 21 is warped to the second fixing surface 2412 and bonded to the second fixing surface 2412, and the part of the screen protector layer 22 is separated from the part of the retention layer 21 and returns to the shape before being pressed.

Specifically, one end of the second fixing surface 2412 is connected to the first fixing surface 2411, and the other end of the second fixing surface 2412 extends obliquely upward at the preset angle.

In some other embodiments, the second fixing surface 2412 may be omitted.

Figure 13:
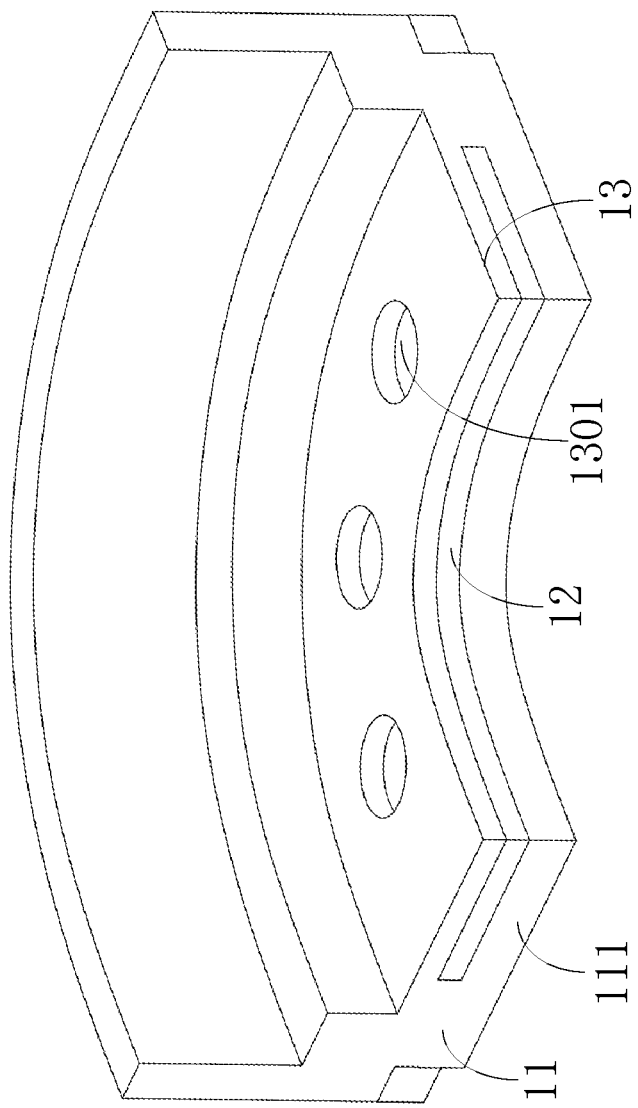
FIG. 13 is a schematic structural view of a screen protector assembly of a screen protector applicator provided in another embodiment of the present disclosure.

Referring to FIG. 13, FIG. 13 is a schematic structural view of a protector applying assembly 10 of a screen protector applicator 100 provided in another embodiment of the present disclosure. In this embodiment, the partition 13 is fixedly connected to the base plate, a mounting groove is provided between the partition 13 and the base plate, and the second matching member 12 is accommodated in the mounting groove.

In a specific implementation process, the partition 13 is integrally formed with the protector applying member 11.

Figure 14:
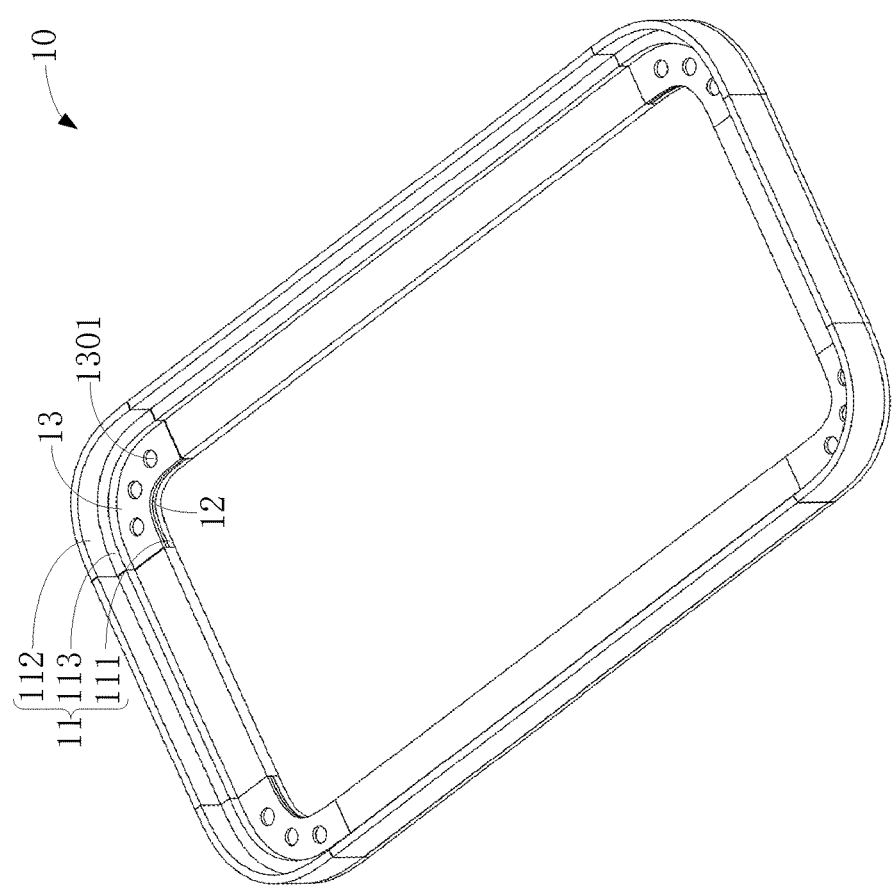
FIG. 14 is a schematic structural view of a screen protector assembly of a screen protector applicator provided in another embodiment of the present disclosure.

Referring to FIG. 14, FIG. 14 is a schematic structural view of the protector applying assembly 10 of the screen protector applicator 100 provided by another embodiment of the present disclosure. In this embodiment, the number of protector applying member 11 is one, the protector applying member 11 is a rectangular frame structure, and the protector applying member 11 is integrally adapted to the outline of the device to be applied with the protector. During protector application, the protector applying member 11 is integrally set on the outside of the device to be applied with the protector.

The corners of the protector applying member 11 may be arc-shaped or right-angled.

In this embodiment, the four corners of the protector applying member 11 are each provided with a second matching member 12 and a partition 13.

In some other embodiments, the protector applying member 11 may also be arranged correspondingly according to the outline of the device to be applied with the protector. For example, when the device to be applied with the protector is circular, the protector applying member 11 is a circular frame structure.

Finally, it should be noted that: the above embodiments are only used to illustrate the technical solutions of the present disclosure, rather than to limit them; according to the idea of the present disclosure, the technical features in the above embodiments or different embodiments may also be combined, the steps may be implemented in any order, and there are many other changes in different aspects of the present disclosure as described above, which are not provided in detail for brevity; although the present disclosure has been described in detail with reference to the foregoing embodiments, it should be understood by those skilled in the art that: it is still possible to modify the technical solutions described in the foregoing embodiments, or perform equivalent replacements for some of the technical features; and these modifications or replacements do not make the essence of the corresponding technical solutions depart from the scope of the technical solutions of various embodiments of the present disclosure.

What is claimed is:

1. A screen protector assembly, comprising:
   a screen protector layer, one side of which is configured to bond to a screen of a device;
   a retention layer bonded to the other side of the screen protector layer; and
   a first matching member fixedly connected to the retention layer, wherein the first matching member is configured to detachably connect and repeatably position the screen protector assembly to a screen protector applying assembly, by at least two positioning contacts of the first matching member;
wherein the retention layer and the screen protector layer are separated in an area.

2. The screen protector assembly of claim 1, further comprising a cover layer bonded on the one side of the screen protector layer.

3. The screen protector assembly of claim 1, wherein the retention layer is dimensioned to conform to the screen protector layer.

4. The screen protector assembly of claim 1, wherein bonding strength between the screen protector layer and the screen is greater than bonding strength between the retention layer and the screen protector layer.

5. The screen protector assembly of claim 1, wherein connection strength between the retention layer and the first matching member is greater than the bonding strength between the retention layer and the screen protector layer.

6. The screen protector assembly of claim 1, wherein the screen protector assembly comprises two copies of the first matching member distributed at different positions of the retention layer.

7. The screen protector assembly of claim 1, wherein the screen protector assembly comprises four copies of the first matching member distributed at four corners of the retention layer.

8. The screen protector assembly of claim 1, wherein the first matching member has a ball and the screen protector applying assembly has a socket, or the first matching member has a socket and the screen protector applying assembly has a ball; and
wherein the ball and the socket are configured to form a snap-fit.

9. The screen protector assembly of claim 1, wherein the first matching member comprises a fixing plate;
wherein the fixing plate has a first fixing surface and a second fixing surface, both facing the retention layer;
wherein the first fixing surface is parallel to the retention layer;
wherein the second fixing surface joins the first fixing surface;
wherein the second fixing surface and the first fixing surface form a preset obtuse angle; and
wherein the first fixing surface is fixedly connected to the retention layer in the interior of the retention layer.

10. The screen protector assembly of claim 9, wherein the first matching member is connected to the screen protector applying assembly by magnetic attraction.

11. The screen protector assembly of claim 9, wherein bonding strength between the retention layer and the second fixing surface is greater than bonding strength between the retention layer and the screen protector layer.

12. The screen protector assembly of claim 9, wherein the second fixing surface is farther away from the middle of the retention layer than the first fixing surface, and is configured to facilitate separation between the screen protector layer and the retention layer.

13. The screen protector assembly of claim 9, wherein the first matching member further comprises a boss fixedly connected to the fixing plate, and wherein the boss is configured to repeatably position the screen protector assembly to the screen protector applying assembly.

14. The screen protector assembly of claim 13, wherein the screen protector applying assembly comprises a partition with a positioning hole, and the boss of the first matching member are configured to extend into the positioning hole of the partition.

15. A system comprising a screen protector applying assembly and the screen protector assembly of claim 1, wherein the screen protector applying assembly comprises:
at least two protector applying members, each of the protector applying members comprising a base plate, an enclosure plate and a positioning ridge,
wherein the base plate has a base surface configured to connect to the screen protector assembly;
wherein the enclosure plate extends away from the base surface; and
wherein the positioning ridge has a positioning surface facing away from the base surface, and the positioning surface is configured to support a device to which the screen protector assembly is applied.

16. The system of claim 15, wherein the base surface is configured to detachably connect to the screen protector assembly.

17. The system of claim 15, wherein a height of the enclosure plate relative to the base surface is greater than that of the positioning ridge.

18. The system of claim 15, wherein the enclosure plate has a first limiting surface on an inner side of the enclosure plate, and the first limiting surface is configured to limit movement of the device in a direction parallel to the base surface.

19. The system of claim 18, wherein the positioning ridge has a second limiting surface facing away from the enclosure plate, and the second limiting surface is configured to limit movement of the screen protector assembly in a direction parallel to the base surface.

20. The system of claim 15, wherein one or both of the enclosure plate and the positioning ridge have discontinuous sections.

21. The system of claim 15, wherein the base plate further has an inclined surface connected to the base surface, the inclined surface is closer to the positioning ridge than the base surface, and the inclined surface and the base surface form a preset obtuse angle.

22. The system of claim 15, wherein at least one of the protector applying members has a right-angled bend, and is configured to support a corner of the device.

23. The system of claim 15, wherein at least one of the protector applying members is prismatic in shape, and is configured to support a side of the device.

24. The system of claim 15, wherein at least one of the protector applying members has a prismatic section joined with two right-angled bends, and is configured to support a side and two corners of the device.

25. The system of claim 15, wherein at least one of the protector applying members has a stepped portion on an outer side thereof; wherein the stepped portion is configured to accommodate the enclosure plate of another of the protector applying members, thereby allowing stacking.

26. The system of claim 15, wherein at least one of the protector applying members has a second matching member, wherein the second matching member is configured to detachably connect to the screen protector assembly.

27. The system of claim 26, wherein the second matching member is configured to be connected to the screen protector assembly by magnetic attraction.

28. A screen protector assembly, comprising:
a screen protector layer, one side of which is configured to bond to a screen of a device;

a retention layer bonded to the other side of the screen protector layer; and a first matching member fixedly connected to the retention layer, wherein the first matching member is configured to detachably connect and repeatably position the screen protector assembly to a screen protector applying assembly, by at least two positioning contacts of the first matching member;

wherein the first matching member comprises a fixing plate;

wherein the fixing plate has a first fixing surface and a second fixing surface, both facing the retention layer;

wherein the first fixing surface is parallel to the retention layer;

wherein the second fixing surface joins the first fixing surface;

wherein the second fixing surface and the first fixing surface form a preset obtuse angle; and wherein the first fixing surface is fixedly connected to the retention layer in the interior of the retention layer.

* * * * *